United States Patent [19]

Kunii

[11] Patent Number: 5,654,719
[45] Date of Patent: Aug. 5, 1997

[54] RADIO RECEIVER WITH POSITION LOCATING MEANS

[75] Inventor: Nobuyasu Kunii, Tokyo, Japan

[73] Assignee: Clarion Co., Ltd., Toda, Japan

[21] Appl. No.: 407,777

[22] Filed: Mar. 21, 1995

[30] Foreign Application Priority Data

Mar. 25, 1994 [JP] Japan .................................. 6-079333

[51] Int. Cl.⁶ .................................. G01S 3/02; H04B 1/18
[52] U.S. Cl. .................................. 342/451; 342/457; 455/154.1; 455/158.4
[58] Field of Search .................................. 342/451, 457; 455/151.4, 154.1, 154.2, 158.4, 185.1, 186.2, 186.1

[56] References Cited

U.S. PATENT DOCUMENTS

| | | | |
|---|---|---|---|
| 4,969,209 | 11/1990 | Schwob | 455/158 |
| 5,068,838 | 11/1991 | Klausner et al. | 455/51 |
| 5,152,011 | 9/1992 | Schwob | 455/158.5 |
| 5,152,012 | 9/1992 | Schwob | 455/158.5 |
| 5,280,642 | 1/1994 | Hirata et al. | 455/186.1 |
| 5,393,713 | 2/1995 | Schwob | 455/158.5 |
| 5,493,709 | 2/1996 | Duckeck et al. | 455/185.1 |

*Primary Examiner*—Gregory C. Issing
*Attorney, Agent, or Firm*—Flynn, Thiel, Boutell, & Tanis, P.C.

[57] ABSTRACT

A radio receiver capable of determining its geographic position is disclosed. The radio receiver includes a control unit 15 with access to a storage unit 11 that contains a number of station records 42a, 42b, . . . Each station record contains data representative of the carrier frequency, program type a geographic location of a specific broadcast station. When a listener wants to determine his geographic location, he tunes the radio to a broadcast station. The carrier frequency and program type of the received station are supplied to the control unit. The control unit matches the carrier frequency and program type of the received station with the like data in the station records to find a matched broadcast station. The location of the matched broadcast station is employed as the location of the radio receiver.

14 Claims, 9 Drawing Sheets

FIG.7B

RADIO RECEIVER WITH POSITION LOCATING MEANS

FIELD OF THE INVENTION

The present invention relates to a portable radio used to receive broadcast signals, such as an automobile radio and, more particularly, to a portable radio with an internal assembly capable of determining the radio's geographic location so that the radio can automatically tune to a nearby station that broadcasts the type of program the listener wants to receive.

BACKGROUND OF THE INVENTION

Many radios, especially radios found in cars and other vehicles, include one or more sub-circuits to facilitate the easy tuning of radio's receiver to a station that broadcasts the type of program the listener wants to hear. Some radios employ scanners which automatically scan the airwaves until they pick up signals of a preestablished minimum strength. The received signal is then played so as to give the listener the opportunity to evaluate whether or not he wants to listen to the broadcast program. If the listener does not want to the listen to the broadcast program, he reactivates the scanning circuit so that it locates a new signal which is then played. This process is repeated until the listener locates a broadcast station that is transmitting a program he wants to hear. Car radios can also be programmed with the broadcast frequencies of a number of different broadcast stations. This allows the listener to automatically tune the radio to the station he wants to listen to without having to first scan the broadcast frequency spectrum.

Some station programmable radios include a number of selection buttons equal to the number of stations to which the radio can be programmed. Other programmable radios include a single selection button and a display are provided, and in which the preset broadcasting station codes (or broadcasting station names) are displayed on the display by continuously pressing the selection button. With these radios, when the desired broadcasting station code is displayed the listener starts the reception operation by pressing a reception start button.

These latter programmable radio receivers include radios in which the broadcasting station frequencies are fixedly set, as in radio receivers used in countries with few broadcasting stations (for example, Japan). Programmable radios have also been provided employing a system in which the listener can preset the broadcast frequencies of desired broadcasting stations. These radios are typically used in countries in which there are a large number of broadcasting stations (for example, America).

Listener programmable radios are often supplied with a scanning circuit. This allows the listener to scan the broadcast frequency spectrum by pressing a search key which is provided on the radio receiver, scanning is halted at received frequencies of a fixed strength. The listener then selects whether or not to program the broadcast frequency, and desired broadcast frequencies are successively selected and recorded in a preset memory. Then, in order to receive a broadcast, the listener selects a desired broadcast station from amongst the programmed stations, and starts the reception operation, by continuously pressing a selection button.

In North American radio broadcasting stations, the type of program which is broadcast (for example music programs such as jazz, or news) is fixed for each broadcasting station. There are receivers which are configured such that data indicating which type of broadcast a particular broadcasting station performs is held in a database (specifically, the frequency, type of radio station, and a type indicator name, for example, are stored in a memory device such as a ROM or a PROM.) Based on this, the broadcast frequencies of desired broadcasting stations are recorded in a preset memory, and when a program is to be received, the desired program is received by successively reading them out (refer to Japanese Laid-open Patent Number H1-117529 ("broadcast receiver")).

In the conventional broadcasting receiver disclosed in the above mentioned Japanese Laid-open Patent Number H1-117529 (referred to as a receiver with an ID-LOGIC function), not only does the above mentioned database contain data consisting of the broadcasting frequency and the type, but also regional information indicating the geographic location of the broadcasting station is held as data. This information, the geographic location of the broadcast station, is important because in some parts of the world, such as in North America, there are a large number of broadcasting stations which have the same frequency. Accordingly, the data for the broadcast stations is first grouped by state or province, and then divided into broadcasting stations within a state or province. It should be noted that examples of ID-logic types include classical, jazz, public, country, news and/or talk radio.

Next, in describing an example of the operation of the above mentioned ID-logic function, (1) the listener specifies the point at which he is located (data for the state in which one is located is input, and then data for the city which has the broadcasting station one wishes to listen to is input (in America, for example, there are many cases in which broadcasting stations have been established concentrated in particular cities, and therefore there is no certainty that there will be a broadcasting station in the city which includes the current position of the listener (receiver). In such cases, the listener selects from a map the city which is nearest to the city in which the listener (receiver) is currently located, and sets this)). e.g., state selection: Nevada; city selection: Las Vegas (2) After completing selection of the state and the city, the listener performs the reception operation instruction by pressing a reception key, and the data corresponding to the reception frequency of the broadcasting station are retrieved from the ROM and the type is displayed. e.g., reception frequency: 87.9 MHz, type: popular music In addition, the ID-logic function can also search the broadcasting stations by type, using the database.

With radio receivers which perform type searching using the above mentioned ID-logic function, the listener must first specify the current position (of the receiver), and it is necessary to refer to a map, and input city (region) data. Although it is troublesome to input such city (region) data whilst looking at a map, the operation to set the city data is not particularly troublesome if the position of the receiver is fixed, or is within the reception area of the specified broadcasting station, in cases in which the position of the receiver is variable.

However, if consideration is given to a radio receiver installed in a vehicle, distances covered by the vehicle are great, particularly in countries such as America which have a car-based society. Thus there are many cases in which the reception area of broadcast radio waves of the specified broadcasting station is exceeded, and in some cases it is necessary to reset the city data frequently.

When vacationing in a car, for example, if a desired type of radio broadcast is being listened to using the ID-logic function, then the vehicle will become separated from the position of the initially specified broadcasting station, due to the movement of the vehicle. As the limit of reception of the broadcast radio waves is approached, it will become impossible to receive the broadcast radio waves, and the listener will perform a seek operation (radio wave search operation to receive broadcast radio waves) in order to listen to the desired type of broadcast, with the intention of listening to a corresponding type of broadcast which can be received. But, even if the receiver is tuned to the frequency of the type of broadcast which the listener wishes to receive, there is the problem that the city data (in other words the broadcasting station) will be different. It will thus be impossible to listen to the corresponding type of broadcast, and in order to listen to the corresponding type of broadcast it will be necessary to set the new city data (in other words the data for the nearest city in which the desired type of broadcasting station has been established, in the region through which the vehicle is currently passing).

In order to solve the above mentioned problem, the current position is corrected by the ID-logic function at fixed time intervals or fixed distances. In this case the correction is performed using, for example, direction keys indicating the direction in which one is currently moving from the initially set position (keys provided on the receiver indicating N (north), S (south), E (east) W (west).

However, radio receivers are not the only sound sources (sound systems) installed in vehicles, and CDs and cassette tape devices are also installed. Thus the listener will not always listen continuously to radio programs only, but may listen to a program, occasionally listen to music or the like recorded on a CD or cassette tape, and then return to the radio program.

Thus if, for example, the vehicle is started from the initially set position (without a radio broadcast being listened to) whilst the listener is listening to music or the like recorded on a CD, and then the listener operates the ID-logic function in order to listen to a radio program after the vehicle has traveled for some time, there is the problem that, since the set position and the current position are different, the ID-logic function does not function correctly. Further, there is the problem that the current position after traveling is not adjacent to the initially input position. Thus even if direction key operation is performed in order to correct the position, as described above, it is not possible to correct the position.

In such cases there is the inconvenience that it is necessary to reset the position information (city, region data) whilst looking at a map. Moreover, if there is no map, it may not be possible to set the information appropriately.

SUMMARY OF THE INVENTION

The present invention takes account of the above mentioned problems and inconvenience. The present invention aims to provide a radio receiver which permits reception of a desired broadcast program, by presetting the broadcast frequency of the desired broadcasting station in the receiver, wherein the radio receiver permits setting of the current position information by means of a simple operation without looking at a map.

Figure 1A:
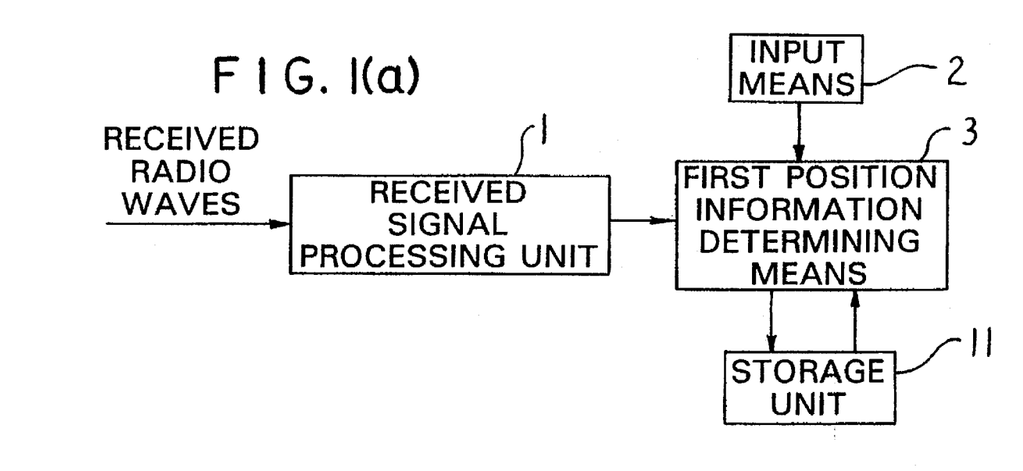
FIGS. 1(a), 1(b) and 1(c) are block diagrams that illustrate the basic functional elements of the radio receiver of this invention.

In order to achieve the above mentioned aims, the radio receiver of a first embodiment of this invention, as shown in FIG. 1(a), is a radio receiver comprises: a storage unit 11 which stores a plurality of units of broadcasting station data, where one unit of broadcasting station data includes classification data comprising the broadcast frequency and the broadcast program, and broadcasting station position information; a received signal processing unit 1 which performs received signal processing on the broadcast radio waves and regenerates the broadcast program, wherein said radio receiver comprises an input means 2 for inputting classification selection information for selecting classification information for a broadcast program which has been regenerated by means of the above mentioned received signal processing unit; and a first position information determining means 3 which determines the broadcasting station position information corresponding to the current position of the radio receiver based on the above mentioned input classification selection information and the frequency of the broadcast radio waves of the regenerated broadcast program.

Figure 1B:
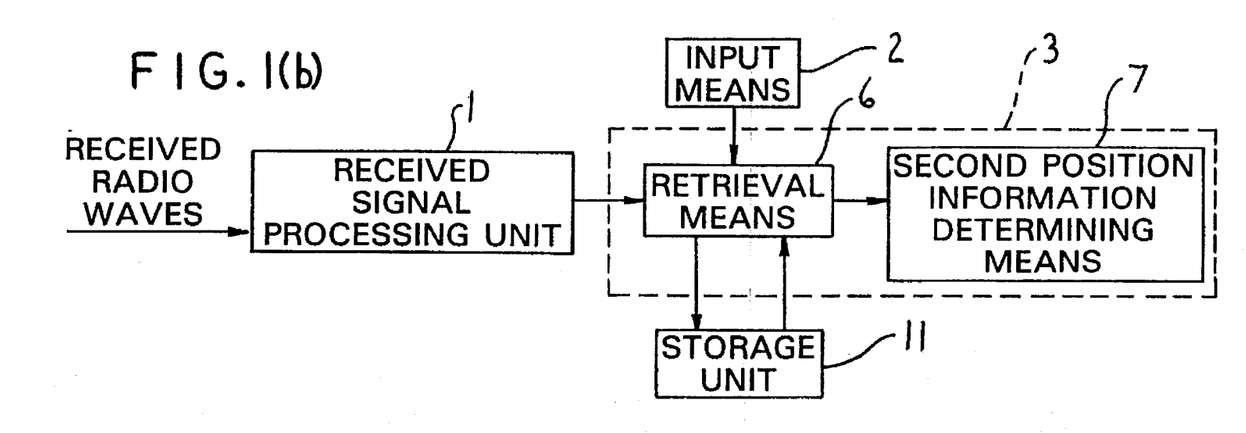

As shown in FIG. 1(b), the radio receiver of a second embodiment of this invention is a radio receiver comprises: a storage unit 11 which stores a plurality of units broadcasting station data, where one unit of broadcasting station data comprises includes classification data comprising the broadcast frequency and the broadcast program and broadcasting station position information; a received signal processing unit 1 which performs received signal processing on the broadcast radio waves and regenerates the broadcast program, wherein said radio receiver comprises an input means 2 for inputting classification selection information for selecting classification information for a broadcast program which has been regenerated by means of the above mentioned received signal processing unit; a retrieval means 6 which, when the above mentioned classification selection information has been input, retrieves the plurality of broadcasting station data from the above mentioned storage means and based on said classification selection information and the frequency of the broadcast radio waves of the broadcast program which has been regenerated, and picks out the corresponding broadcasting station data; and a second position information determining means 7 which determines the selection of the broadcasting station position information corresponding to the current position of the radio receiver based on the broadcasting station data which has been picked out by the above mentioned retrieval means 6.

Figure 1C:
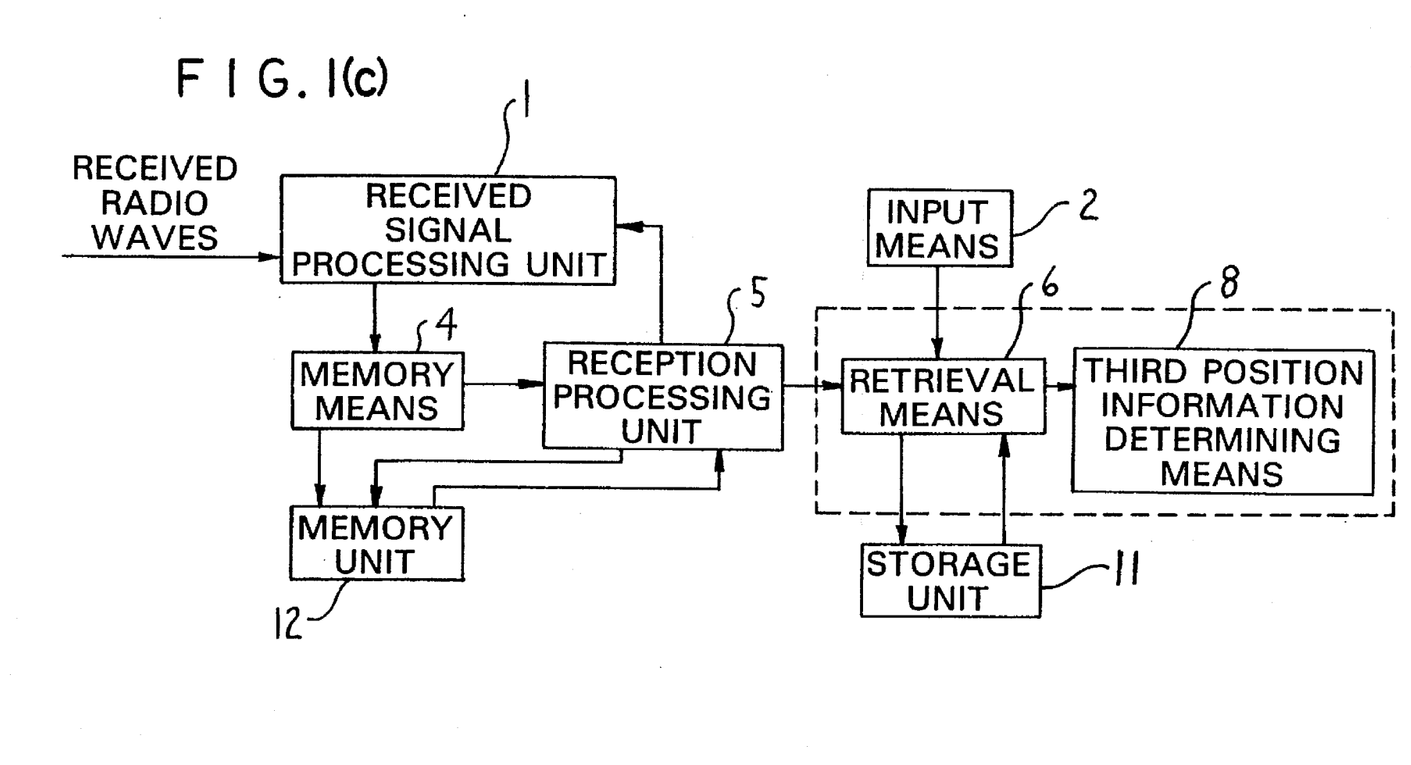

As shown in FIG. 1(c), the radio receiver of a third embodiment of this invention is a radio receiver comprises: a storage unit 11 which stores a plurality of units of broadcasting station data, where one unit of broadcasting station data including classification data comprising the broadcast frequency and the broadcast program, and broadcasting station position information; a received signal processing unit 1 which performs received signal processing on the broadcast radio waves; a memory unit 12 with a memory means 4 which records successively in the memory unit the frequencies of broadcast radio waves received by means of the above-mentioned received signal processing unit 1; a reception control means 5 which, after the received signal processing operation in the above mentioned received signal processing unit 1 has been completed, causes a received signal processing operation to be performed on the broadcast radio waves, in the above mentioned received signal processing unit, for each broadcast radio wave frequency which has been recorded in the above mentioned memory unit 4; an input means 2 for inputting classification selection information for selecting classification information for each broadcast program which has been regenerated by means of the above mentioned received signal processing unit; a retrieval means 6 which, when the above mentioned classification selection information has been input, retrieves the plurality of broadcasting station data in the above mentioned storage unit, based on the frequency of the received signal radio waves and said classification selection information, and picks out the corresponding broadcasting station data; and a third position information determining means 8 which selects and determines the broadcasting station position information corresponding to the current position of the radio receiver, based on the broadcasting station data which has been picked out by the above mentioned retrieval means 6.

In the radio receiver of the first embodiment of the invention intended to achieve the above mentioned objectives, the classification or program format information of a received regenerated broadcast program is entered by means of the input classification selection information. The position information of broadcasting stations which can be received is then obtained by means of the first position information determining means, based on the classification selection information and the frequency of the broadcast radio waves of the regenerated broadcast program, and the position information of the broadcasting station which is to be selected is determined.

In the radio receiver of the second embodiment of this invention, the classification information of the regenerated broadcast program is entered by means of the input classification selection information. The plurality of broadcasting station data in the storage unit 11 are retrieved by means of the retrieval means 6, based on the classification selection information and the frequency of the broadcast radio waves of the regenerated broadcast program and the corresponding broadcasting station data are picked out. The position information of the broadcasting station corresponding to the current position of the radio receiver is selected and determined by means of the second position information determining means 7, based on the picked out broadcasting station data.

In the radio receiver of the third embodiment of this invention, firstly the frequency values of broadcasting radio waves which can be received are successively recorded in the memory unit 12 by means of the memory means 4. The recorded frequency values of the broadcast radio waves are then successively read out from the memory unit 12 by means of the reception control means 5, and received signal processing operations are performed on the broadcast radio waves in the received signal processing unit I for each frequency. The classification information of the regenerated broadcast program is then input by means of the input means 2, and when the classification selection information has been input, the plurality of broadcasting station data in the storage unit 11 are retrieved by means of the retrieval means 6, based on the classification selection information and the frequency of the received radio waves, the corresponding broadcasting station data are picked out. The position information of the broadcasting station corresponding to the current position of the radio receiver is selected and determined by means of the third position information determining means 7.

Consequently, according to the first through third embodiments of this invention inventions, the radio receiver can automatically determine the position of the received broadcasting stations in order to determine its own current position. Thus the listener to a broadcast program can set the current position information by means of a simple operation without looking at a map.

DETAILED DESCRIPTION

Figure 2:
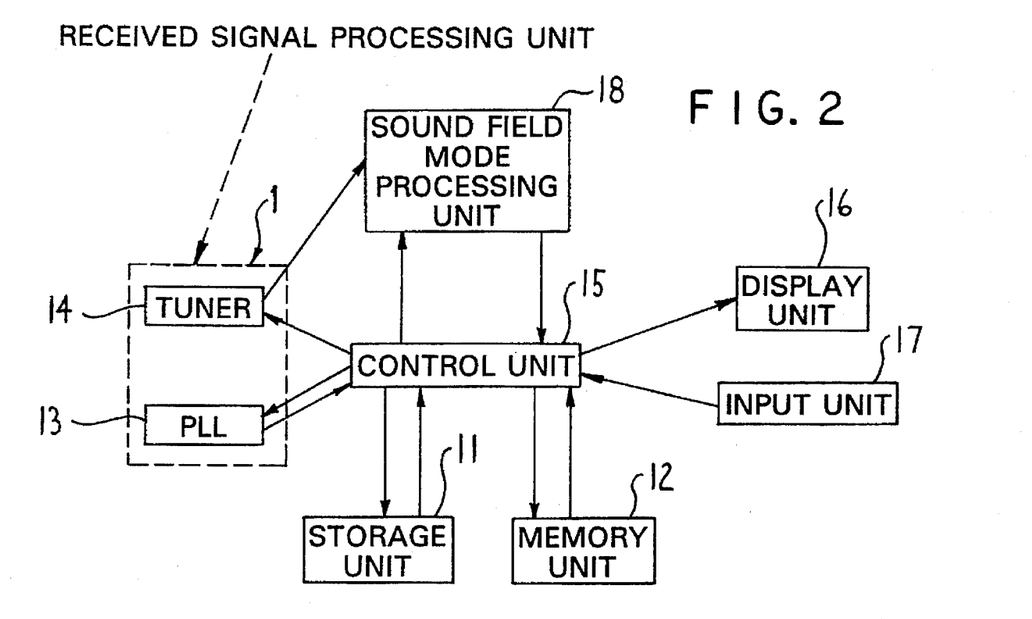
FIG. 2 is a block diagram of the elements of the radio receiver of this invention.

FIG. 2 is a block diagram showing an example of the configuration of one embodiment of a radio receiver to which the present invention can be applied, where 11 is a storage unit, 12 is a temporary memory unit which temporarily records data and the like, 13 and 14 are received signal processing units (13 is a PLL circuit, 14 is a tuning circuit), 15 is a control unit, 16 is a display unit, 17 is an input unit and 18 is a sound field mode processing unit.

A writable ROM such as a PROM is used as the storage unit 11, and broadcasting station data groups (broadcasting station files), in which one unit record comprises data comprising broadcasting frequency and specific generic information, divided by broadcasting station location (state, city) and type, and programs, for example, are stored in advance in the storage unit 11. Further, a channel memory area is maintained in the storage unit 11, and the desired broadcast frequencies (preset data) obtained by means of the present invention are stored therein.

Figure 6:
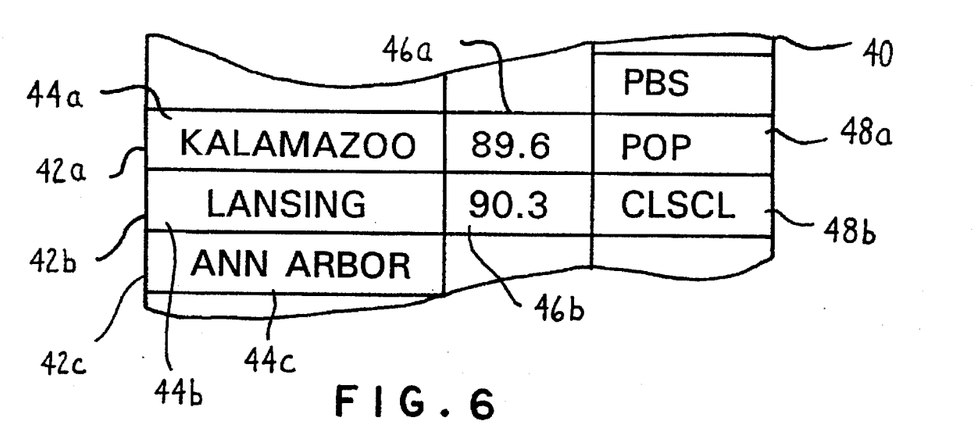
FIG. 6 is a partial depiction of the station file for a particular state that is contained in memory of the position locating means of the radio receiver of this invention.

FIG. 6 illustrates the partial contents of a station file 40 a particular geographic region, in this case the State of Michigan. The station file 40 contains a number of individual records 42a and 42b each of which includes data about a particular broadcast that broadcasts in the state. Specifically, each record 42a and 42b includes a location field 44a and 44b, respectively, a frequency field, 46a and 46b, respectively, and a program type field, 48a and 48b, respectively. The location fields 44a and 44b contain indications of the cities in which the associated stations are located. Frequency fields 46a and 46b contain data indicating the carrier frequency over which the associated station broadcast their signals. Program type fields 48a and 48b contain codes that indicate the broadcast format of the station. For example a program type field may indicate that a station is a news station, a pop radio station, a public broadcasting station, a sports station, a talk radio station or a classical radio station.

Memory for temporary recording, such as RAM, is used as the memory unit 12, and data updates (renewal, alterations) and type data are temporarily recorded therein. Further, a preset channel working area is maintained in the memory unit 12.

The received signal processing unit 1 receives broadcast radio waves and extracts the baseband signal from the modulated wave. It should be noted that a tuner pack, for example, is used as the tuning circuit 14, and during preset, scanning is performed in the range which has the desired type of broadcast frequency. Further, during reception, the preset frequency radio waves are selected and received, and the baseband signal is extracted from the received modulated wave by the PLL circuit 13.

A CPU such as a microcomputer is used as the control unit 15, and the control unit 15 controls the operation of the whole of the receiver (each component), and performs frequency selection control (refer to FIG. 3 and FIG. 4, hereinbelow) based on the present invention.

The display unit 16 displays the broadcasting station location code (or location name), the type code (or type name) and the frequency, for example, during presetting or reception, and also displays to the user an input guide for operating the receiver, for example.

A key matrix is provided in the input unit 17, and the user keys in instructions from the input unit 17 such as broadcasting station presetting, and reception instructions. Keys which are provided include, for example, a seek key for instructing the receiver to begin the seek operation, a position confirm key, alphabetical keys for inputting names and the like, a news key, a jazz key, a pops key, . . . , as type selection keys, and a CH key, used as a reception channel selection key.

Figure 7A:
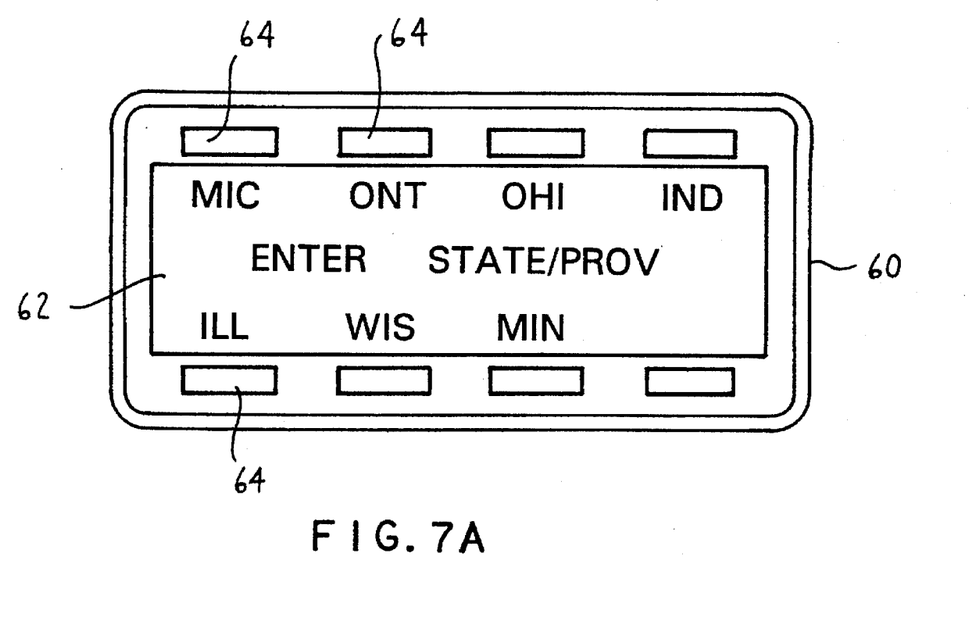
FIGS. 7A and 7B depict the face of an intelligent data display-data entry panel that can be employed with the position locating means of the radio receiver of this invention.

FIG. 7A illustrates a data input device 60 that may alternatively be incorporated into the receiving system of this invention. The data input device 60 includes a center located display panel 62 on which a number of lines of alphanumeric data may be displayed. Display panel 62 may, for include an assembly of selectively activated light emitting diodes or may take the form of a flat panel electroluminescent display. A set of data entry keys 64 are located around the display panel. In the depicted version of the invention four data entry keys 64 are located above the display panel 62 and four data entry keys are located below the display panel. The message presented on the display panel is controlled by the microcontroller 15; the data supplied by the actuation of the display keys 64 is forwarded to the control unit 15.

The instructions presented on the display panel 62 and the data entered though keys 64 are a function of what point the listener is in during the process of operating the system in order to determine first the location of the receiver and, then to select the type of radio station to which he wants to listen. For example, as illustrated in FIG. 7A, during the initial part of the locating process, when the listener is directed to enter state location, the center line of the display panel 62 will include the message: ENTER STATE\PROV. The top line of the display panel lists the following states and province immediately under the upper data entry keys 64: MICH ONT OHIO IND. The bottom line of the display panel 62 will indicate the other nearby states adjacent the lower data entry keys 64 with the message: ILL WIS MIN.

The sound field mode processing unit 18 consists of a DSP (digital signal processor) and it processes the sound field mode when a music program is being received.

Figure 3:
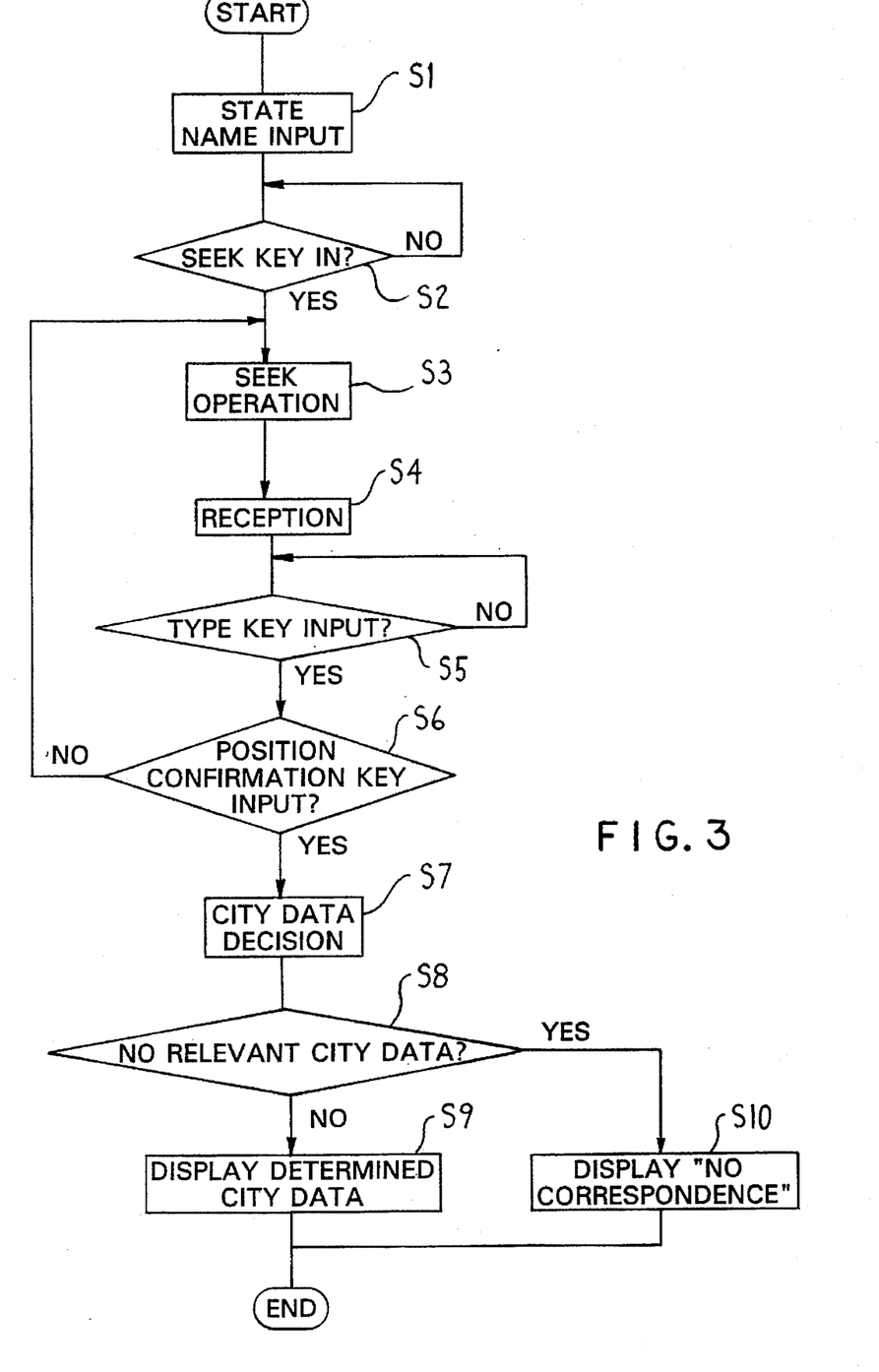
FIG. 3 is a flowchart showing one embodiment of operation of the position locating means of the radio receiver of this invention.

FIG. 3 is a flowchart showing one embodiment of the operation of the control unit 15 during input of radio receiver position information (city data, region data) based on the present invention.

In step S1, the control unit 15 performs the command to display a state data input guide (for example "Input the state name alphabetically") on the display unit 16 in order to prompt the listener to input the state data (in this case the state name). Thus when the listener has input the state name from the input unit 17, the state name data is output to the memory unit 12 which is a temporary recording area, and is recorded in the memory unit 12, and the process then moves to step S2.

Figure 5:
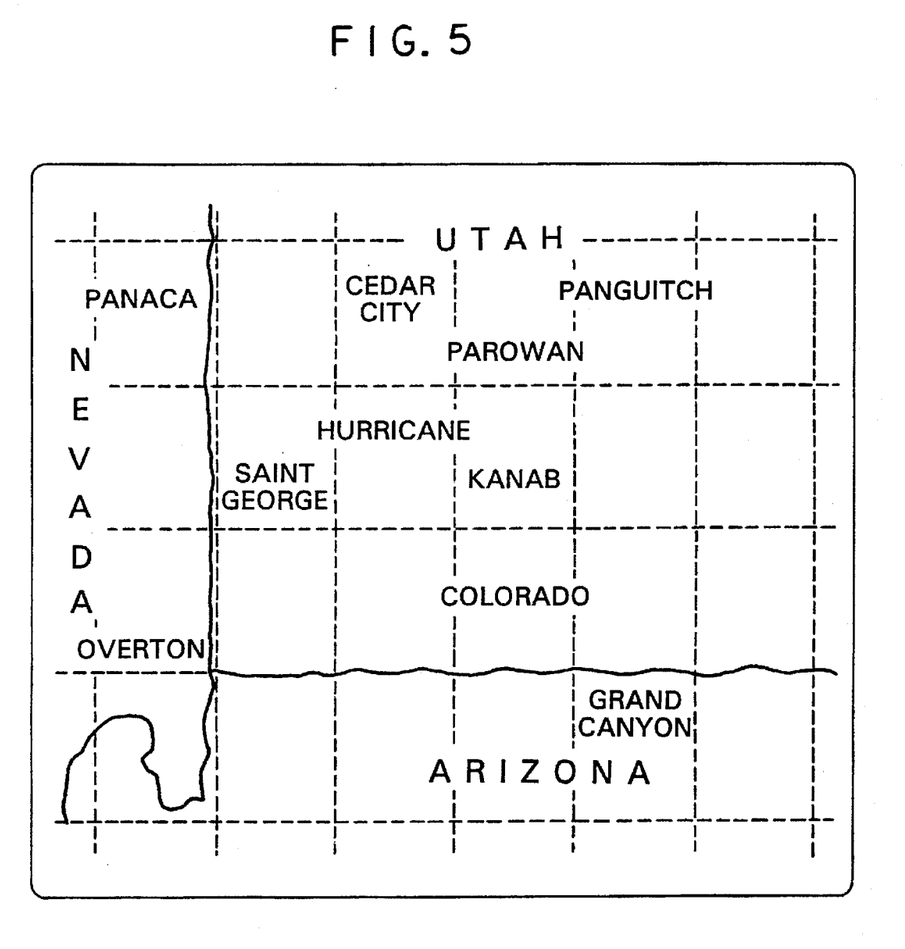
FIG. 5 is an example of a map.

Here, since the ID-logic function is being used, it is necessary firstly to input the state data (in a country with a large area, such as America or Russia, this will be the state name, and in the countries of the EC it will be the country name) alphabetically, in code or using the display panel 60 in order to specify the desired type of broadcasting station. This specification of the state name (or country name) is simple, and does not require one to look at a map. Further, even if reference is made to a map, the state name is typically tends be clearly marked, as shown in FIG. 5 (in FIG. 5 the state boundaries are shown by thick lines, and cities which have broadcasting stations are demarcated by rectangles comprising broken lines).

In step S2, the control unit 15 monitors whether or not the seek key of the input unit 17 has been pressed. When it detects that the seek key has been pressed, the process moves to step S3. If the seek key is not pressed, then the seek key input waiting operation is repeated until the seek key is pressed.

In step S3, the control unit 15 issues a broadcast radio wave reception command to the received signal processing unit 1. The received signal processing unit 1 forms a seek operation in the region which has broadcast frequencies, and the received frequency values of a fixed strength obtained thereby are outputed to the control unit.

In step S4, the control unit 15 commands the received signal processing unit 1 to execute received signal processing, and provides the frequency values which are to be received.

The received signal processing unit selects and receives the corresponding frequency broadcast waves by means of the tuning circuit 14, based on the provided frequency values, and the baseband signal is extracted from the received modulated wave in the PLL circuit 13. The baseband signal is regenerated as sounds (voice) provided to the sound field mode processing unit 18.

Figure 7B:
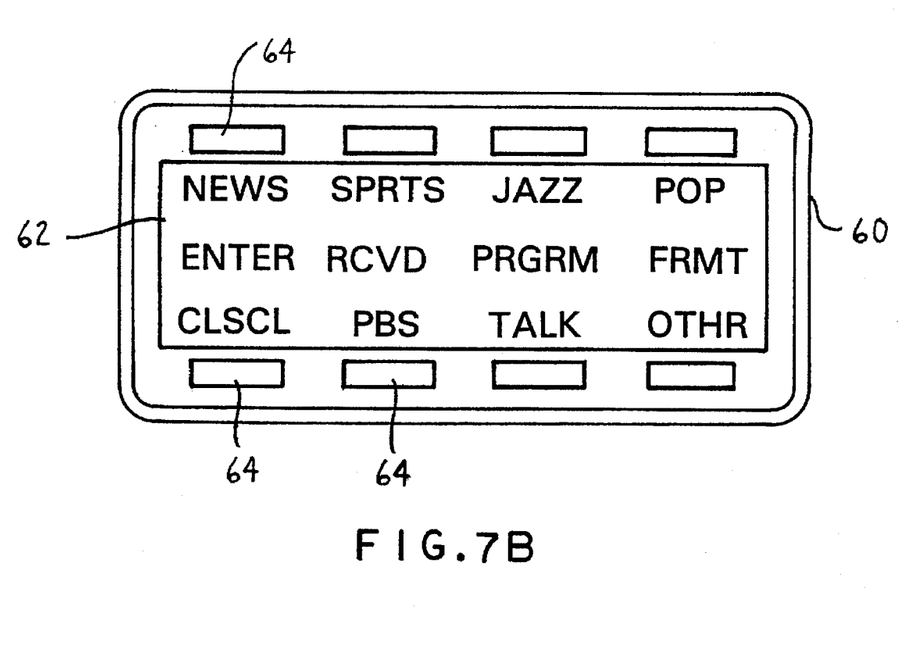

In step S5, the control unit 15 monitors whether or not the user, upon listening to the contents of the regenerated broadcasts, has pressed a type selection key such as provided on the input unit 17 or, as depicted by FIG. 7B, by display panel 60, indicating the contents of the broadcast. If the control unit 15 detects that a type selection key has been pressed then it outputs a code indicating the type to the memory unit 12 and records the corresponding frequency value and type code in the preset channel working area. If a type selection key has not been pressed then the type selection key input waiting operation is repeated until a type selection key is pressed.

For example, if the sought frequency is 87.1 MHz, and if upon listening to the contents of the broadcast its type is jazz, then the jazz key is pressed.

In step 86, the control unit 15 commands the display unit 16 to display a confirmation input guide (for example "Press the position confirm key to confirm the position") to the listener in order to determine whether or not to perform position confirmation processing step S7, when a certain type key has been input.

The control unit 15 monitors whether or not the listener has pressed the position confirm key. If it detects that the position confirm key has been pressed, then the process moves to step S7. If the position confirm key has not been pressed even after a fixed time has elapsed, the process returns to step S3 and the processes of steps S3 through S6 are repeated. It should be noted that the start of the position confirmation guide display may be moved to step S6 if the number of types input in step S5 is counted and exceeds a fixed number.

In step S7, the broadcasting station file in the storage unit 11 is retrieved, using the state data, frequency and type data obtained by means of the above mentioned steps S1 through S5 as a key, and the city data (city name) for all of the relevant broadcasting station data which have been retrieved are picked out.

Next, in step S8, it is determined whether or not any city data have been picked out (in other words whether or not any of the retrieved broadcasting station data correspond to the frequency and program type of the scanned station.) If the station file 60 does not include any station record 42a or 42b for the scanned station, then a message to this effect is displayed on the display unit 16 in step S10 (for example "There is no such type of broadcasting station in the present area").

If a station record 42a or 42b is found with a carrier frequency and program format that corresponds to the scanned station, the city contained in the associated location filed 48a or 48b is determined to be the city corresponding to the current position of the radio receiver, and the name of the city is displayed on the display unit 16 in step S9.

In some versions of the invention, the city displayed may not be the closest actual city, but the closest city with a large number of broadcasting stations. If, for example, Nevada is input as the state data and the names of cities in which broadcasting stations with the following frequencies and types have been established are obtained, then the city which is determined to be the current position will be Las Vegas, which has the most broadcasting stations.

It should be noted that in the flowchart of FIG. 3, steps S2 through S4 correspond to the operation of the received signal processing unit 1. Steps S5 and S6 correspond to the input means. Step S7 corresponds to the retrieval means 6. Steps S8 through S10 correspond to the second position information determining means 7. Further, steps S7 through S10 correspond to the first position information determining means 3.

Figure 4:
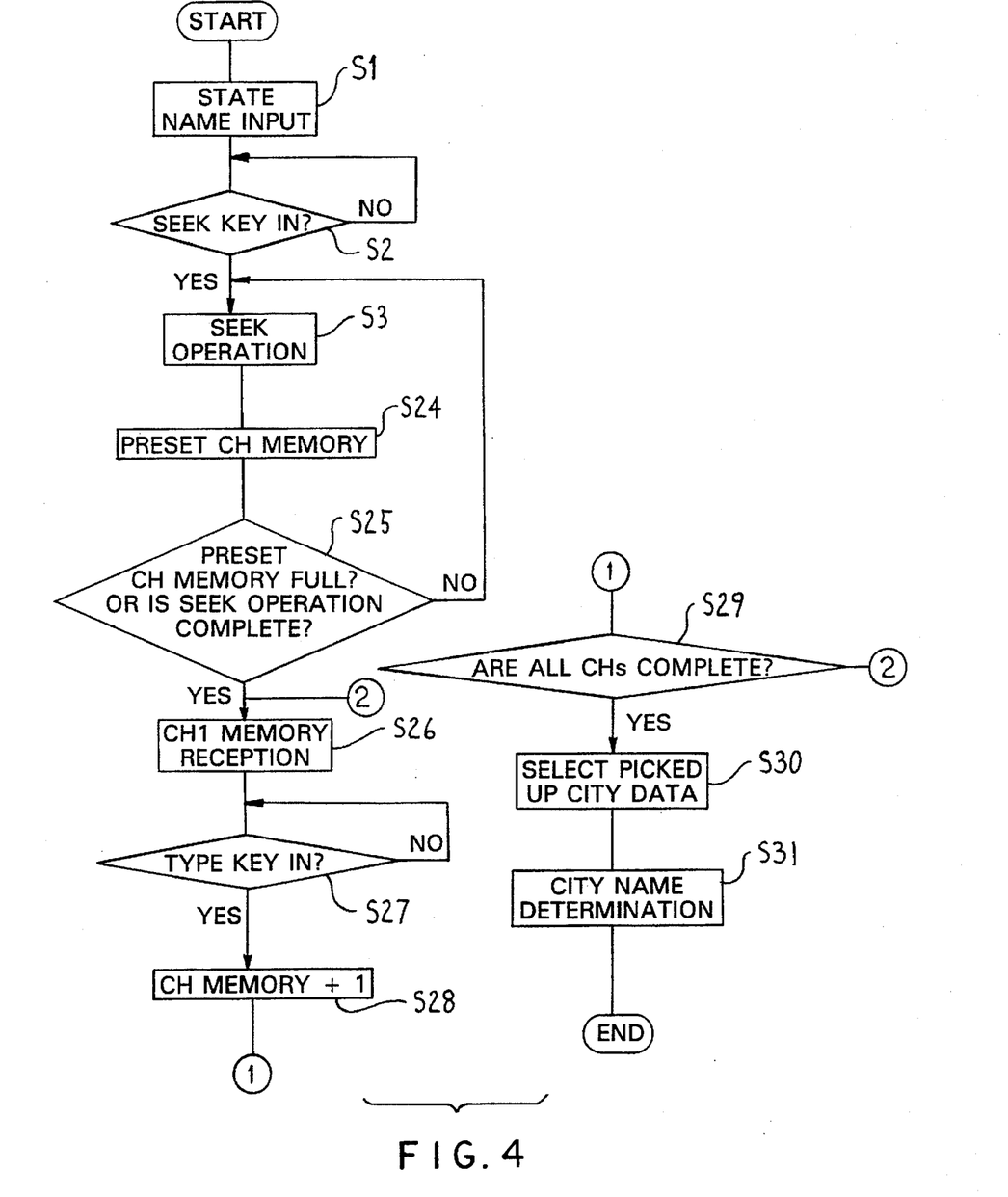
FIG. 4 is a flowchart showing an alternative embodiment of the position locating means of the radio receiver of this invention.

FIG. 4 is a flowchart showing another embodiment of the operation of the control unit 15 during input of radio receiver position information (city data, region data) based on the present invention.

The operation of steps S1 and S2 in FIG. 4 are the same as in FIG. 3, described above.

In step S3, the control unit 15 issues a command to the received signal processing unit to receive broadcast radio waves, and the received signal processing unit 1 successively performs the seek operation in the broadcasting frequency range, and received signal frequency values of a fixed strength which are obtained are output successively to the control unit 15. When the control unit 15 receives received signal frequency values of a fixed strength, it outputs these frequency values to the memory unit 12, where they are successively recorded in the preset channel area (CHI) maintained in the memory unit 12.

In step S24, each time the control unit 15 receives a received signal frequency value of a fixed strength, it outputs the frequency value to the memory unit 12, and successively stores the values in the preset channel working area provided in the memory unit 12.

In step S25, the control unit 15 checks the capacity of the preset channel working area. When the capacity is full or the seek operation has finished, the process moves to step S26. In all other cases the operations of steps S3 through S25 are repeated. It should be noted that the preset channel working area capacity check counts the number of frequencies which are recorded, and it should compare the capacity obtained by multiplying the predetermined data length (byte) of the frequency by the count value, with the preset channel working area capacity.

After the seek operation has been completed, in step S26 the control unit 15 commands the received signal processing unit 1 to execute received signal processing. At this time, the control unit 15 provides the frequency values which are recorded in the preset channel working area of the memory unit 12 to the received signal processing unit 1.

The received signal processing unit 1 selects and receives the broadcast radio waves of the corresponding frequency by means of the tuner circuit 13, based on the received frequency value. The baseband signal is extracted from the received modulated wave by the PLL circuit 14. The baseband signal is generated as sound (voice) output to the sound field mode processing unit 18.

In step S27, the control unit 15 monitors whether or not the user, upon listening to the contents of the regenerated broadcasts, has pressed a type selection key (provided in the input unit 17 or on the input device 60) indicating the broadcast format of the received station. If it detects that a type selection key has been pressed, then it outputs a code indicating the type to the memory unit 12, the type code is recorded in the address corresponding to the corresponding frequency value in the preset channel working area, and the process moves to step S28.

If, for example, the frequency is 87.9 MHz, and upon hearing the contents of the broadcast its type is pop music, then the pops key is pressed.

If a type selection key is not pressed then the type selection key input waiting operation is repeated until a type selection key is pressed.

In steps S28 and S29, the processes of the above mentioned steps S26 and S27 are repeated for all of the frequencies recorded in the preset channel working area. The station file 40 for the selected state in the storage unit 11 is retrieved, using the resulting state data, frequency and type data as a key, and the city data (city name) for all of the retrieved corresponding broadcasting station data are picked out.

Next, in steps S30 and S31, the control unit 15 establishes the geographic location of the radio receiver. This determination is made by correlating the station frequency and broadcast format data for the received station stored in the channel working area with the data contained in the station file 40. The control unit 15 establishes the location of the radio by determining the location with the highest correlation of the data for the received broadcasting stations with the data stored in the station file 40. Steps 30 and 31 are performed by first determining for each location the number of stations for which the received broadcast station frequency and type agree with the records 42 stored in the station. Initially, the determination is made based on the highest number of agreements. If two or more narrow geographic areas have the same, highest number of stored station-received station agreements, the determination is made by determining for which narrow geographic region there is the highest correlation of received stations to stored stations.

It should be noted that in the flowchart of FIG. 4, steps S2 and S3 correspond to the received signal processing unit 1. Steps S24 and S25 correspond to the memory means 4. Step S26 corresponds to the reception control means 5. Step S27 corresponds to the input means 2. Steps S28 and S29 correspond to the retrieval means 6. Steps S30 and S31 correspond to the third position information determining means. Further, steps S28 through S31 correspond to the first position information determining means 3.

By means of the embodiments of the operation of the control unit 15 described above, it is possible to have a construction such that after the city data is determined, the city name is input from the input unit 17 as city data, and it is also possible to have a construction such that the determined city data are automatically specified.

After specifying the city data, the broadcasting station file in the storage unit 11 is retrieved using the state data, the city data and the type data as a key, then the corresponding broadcasting station data should be recorded in the channel memory.

After completing the preset operation, the user can listen to a program simply by pressing the CH key. Further, if the user has tired of the program which he is currently listening to he can change to successive broadcasting stations simply by pressing the CH key.

The control unit 15 can also be configured so that after the location of the receiver is determined, the city data, that, by reference to the station file 60, the station records 42a, 42b, ... for the nearby broadcasting stations that the radio can be received will be pulled up. Then, based on the data contained in the program fields 48a, 48b, ... for the retrieved stations, the control unit may generate a message on the display unit 60 asking the listener to indicate the format of the broadcast he wants to receive. For example, display panel 62 may present the following instruction, ENTER PROGRAM CHOICE, with the following choices, NEWS POP SPRTS CLSCL. Once the listener has made his choice, control unit 15 will command the received signal processing unit 1 to tune to the frequency of the selected choice.

In some densely populated regions, there may be a number of broadcast stations that broadcast the same basic type of program. In these regions, the control unit 15 may inform the listener that there are multiple broadcast stations playing the same type of programming by presenting the message as part of the program selection process. For example, if the radio receiver is in a location where it can receive three pop radio stations, control unit 15 may generate the message as POP1 POP2 POP3 on display panel 62 as part of the station select process in order to inform the listener of this fact.

The initial geographic positioning of the invention may also be adjusted for use in areas with large populations. For example, if the listener initially indicates that he is in a state with a large population and numerous broadcast stations, the control unit may direct the user to further identify the region in which he is located before beginning the detailed city determination. For example, if the listener indicates that he is in Florida, the control unit 15 may present the message N.FLA or S.FLA? The control unit 15 will then wait for the listener to indicate what part of the state he is in before beginning the city determination. In this version of the invention, the storage unit 11 will contain station files 60 that list broadcast stations by geographic sub-regions.

The control unit 15 may also be configured to simplify the effort required to initially indicate the state in which the radio is located. A space can be set aside in the memory unit 12 to hold an indication of the state in which the listener last indicated he was located. Then, when the city determination process is started, the control unit 15 will direct the listener to indicate if he is in the state in which he was located or the nearby states and provinces. For example, if the listener last indicated that he was in Michigan, the control unit 15 will direct the input device to ask the listener if he is in Michigan or Indiana, Ohio, Ontario, Wisconsin, or Illinois which are the closest nearby states and province.

It may also be desirable to provide embodiments of the radio receiver of this invention with a storage unit 11 for the station files 60 that is in the form of a cartridge type replaceable erasable/programmable ROM. This allows the periodic replacement of the storage unit 11 so that storage unit will always contain a set of station files 60 that list the current program formats of the broadcast stations. This adjusts for the fact that the program formats for individual broadcast stations periodically change and new broadcast stations occasionally start to broadcast.

It should be noted that the method for presetting the types and broadcasting frequencies may also be one in which a memory area (preset memory) for recording the broadcast frequencies corresponding to each type is maintained, according to the memory capacity of the memory unit 12, and may also be one in which a preset memory which presets a number of broadcast frequencies corresponding to a single type is maintained, and each time the type key is pressed the preset memory is rewritten and the broadcast frequencies corresponding to the said type are recorded.

The system can also be configured so that once the received signal fades below a given level, the reception processing unit 5 or control unit 15 directs the received signal processing unit 1 to switch to another frequency. The position information determining means or control unit then updates the position of the radio based on a review of the frequency of the new broadcast station to the frequencies of the broadcast stations stored as records 42. In order to perform this position information renewal, multiple new broadcast stations may be tuned in by received signal processing unit 1; once the frequencies of these stations are stored, they are correlated with the frequencies for the broadcast stations stored in records 42 in order to determine the new location of the radio.

The position information determining means may further include a submodule for verifying it has correctly identifying the location of the radio. This module operates first determining the frequencies of the broadcast programs received by the received signal processing unit 1. The frequencies of the received programs are compared with the frequencies contained in the stored station records 42 for the stations in the determined location. A correlation between the frequencies of the received stations and the frequencies of the nearby stations as indicated by the records 42 retrieved from storage unit 11 is recognized as a condition in which the position information determining means has made the correct location determination. A low correlation condition is recognized as an indication that the position of the radio receiver was incorrectly determined; a message to this effect may be presented on display panel 62.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. A radio receiver for receiving broadcast radio waves transmitted by a plurality of broadcast stations which carry broadcast programs, each broadcast program being a particular type of broadcast program, comprising:

a storage unit which stores a plurality of units of broadcasting station data, where each said unit includes data for one broadcasting station, said data including classification data comprising the broadcast frequency at which the broadcast station transmits radio waves, the type of broadcast program transmitted by the broadcast station and position information for the broadcast station;

a received signal processing unit for receiving radio waves over a range of frequencies which performs received signal processing on the broadcast radio waves received at one frequency from a broadcast station and regenerates the broadcast program;

input means for inputting an indication of the type of broadcast program which has been regenerated by said received signal processing unit; and position information determining means connected to said storage unit for retrieving said units of broadcasting station data, to said received signal processing unit for receiving an indication of the frequency of the received broadcast radio waves and to said input means for receiving the indication of the type of broadcast program regenerated by said received signal processing unit which determines the position corresponding to the current position of the radio receiver based on the indication of the type of the broadcast program which has been regenerated, the frequency of the broadcast radio waves of the regenerated broadcast program and said data contained in said units of broadcasting station data.

2. The radio receiver of claim 1, further including:

a position information renewal means for updating the position information of the broadcasting station corresponding to the above mentioned specified current position of the radio receiver wherein, said position information renewal means comprises: a first means which monitors the state of the received signal of the broadcast frequency during reception; a second means which, when a degradation of the received signal state of the received broadcast frequency is detected by said first means, executes a broadcast radio wave retrieval operation to cause said received signal processing unit to perform said received signal processing on broadcast radio waves at a new, broadcast frequency; and a third means which updates the position of broadcast station information based on the result of comparing the new broadcast frequency detected by said second means, with the broadcast frequency of the broadcasting station data said storage unit.

3. The radio receiver as claimed in claim 2, wherein said second means of said position information renewal means is configured to repeatedly execute a prescribed number of times said process of causing said received signal processing unit to perform said received signal processing so as to determine the broadcast frequencies for a plurality of broadcast stations, and the third means rewrites said position information based on the result of a comparison of the plurality of broadcast frequencies obtained by means of the determination of new broadcast frequencies by second means with the broadcast frequencies of the broadcasting station data in said storage unit.

4. The radio receiver as claimed in claim 2, wherein said position information renewal means includes a fourth means that, when a degradation of the state of the received signal of the received broadcast frequency is detected by the above mentioned first means, executes reception of a preset station and monitors the state of reception thereof, and if degradation of the reception of the preset station is detected, transfers operation to the second means.

5. The radio receiver as claimed in claim 3, wherein said position information renewal means includes a fourth means that, when a degradation of the state of the received signal of the received broadcast frequency is detected by said first means, executes reception of a preset station and monitors the state of reception thereof, and if degradation of the reception of the preset station is detected, transfers operation to the second means.

6. The radio receiver of claim 1, further including:

a verification means which, when the current position information has been specified by said position information determining means determines whether or not said current position information is correct by directing said received signal processing unit to perform said received signal processing on the broadcast radio waves throughout a range of frequencies and by determining at which frequencies broadcast programs are received and by comparing the broadcast frequencies of the broadcast programs received by said received signal processing unit with broadcast frequencies of the broadcasting station data at the position corresponding to the current position information, and a notification means which performs a notification based on the results of said comparison.

7. A radio receiver for receiving broadcast radio waves transmitted by a plurality of broadcast stations which carry broadcast programs, each broadcast program being a particular type of broadcast program, comprising:

a storage unit which stores a plurality of units of broadcasting station data, each said unit of data including classification data comprising the broadcast frequency at which the broadcast station transmits broadcast radio waves, the type of the broadcast program transmitted by the broadcast station, and position information for the broadcast station;

a received signal processing unit for receiving radio waves over a range of frequencies which performs received signal processing on the broadcast radio waves and regenerates the broadcast program;

input means for inputting an indication of the type of broadcast program which has been regenerated by said received signal processing unit;

retrieval means which, when an indication of the type of broadcast program has been input, retrieves said units of broadcasting station data from said storage means and, based on the inputted type of broadcast program and the frequency of the broadcast radio waves of the broadcast program which has been regenerated, selects a particular unit of broadcasting station data; and position information determining means which determines the broadcasting station position information corresponding to the current position of the radio receiver, based on said unit of broadcasting station data which has been selected by said retrieval means.

8. A radio receiver for receiving broadcast radio waves transmitted by a plurality of broadcast stations which carry broadcast programs, each broadcast program being a particular type of broadcast program comprising:

a storage unit which stores a plurality of units of broadcasting station data, where each said unit of data comprises the broadcast frequency at which the broadcast station transmits broadcast radio waves, the type of the broadcast program, and broadcasting station position information;

a received signal processing unit which performs an initial received signal processing operation on the broadcast radio waves, a memory unit and a memory means which records successively in the memory unit the frequencies of broadcast radio waves received by said received signal processing unit;

reception control means which, after the initial received signal processing operation of said received signal processing unit has been completed, causes a second received signal processing operation to be performed on the broadcast radio waves by said received signal processing unit for a plurality of broadcast radio wave frequencies which have been recorded in said memory unit;

input means for inputting an indication of the types of broadcast programs which have been regenerated by means of said received signal processing unit;

retrieval means which, when the indications of the types of broadcast programs have been input, retrieves said units of broadcasting station data in said storage unit, and based on the frequencies of the received signal radio waves and said input indications of the types of broadcast programs, selects the corresponding units of broadcasting station data; and a position information determining means which determines the broadcasting station position information corresponding to the current position of the radio receiver based on said units of broadcasting station data which have been selected by said retrieval means.

9. A radio receiver for receiving broadcast radio waves transmitted by a plurality of broadcasting stations which carry broadcast programs, each broadcast program being a particular type of broadcast program comprising:

a storage unit which stores a plurality of units of broadcasting station data, where each said unit of broadcasting station data includes classification data comprising the broadcast frequency at which the broadcast station transmits broadcast radio waves, the type of the broadcast program, and broadcasting station position information;

a received signal processing unit which performs received signal processing on the broadcast radio waves and regenerates the broadcast program; and a position information determining means which selects said broadcasting station position information for a broadcast station to determine the current position of the radio receiver, wherein said position information determining means is provided with an input means for inputting an indication of the type of broadcast program which has been regenerated by means of said received signal processing unit, and selects the position information for a particular broadcasting station based on said inputted type of broadcast program for the regenerated broadcast program, the frequency of the broadcast radio waves of the regenerated broadcast program and said units of said broadcasting station data.

10. The radio receiver as claimed in claim 9, wherein said position information determining means includes retrieval means which, when said indication of the type of received broadcast program has been input, retrieves said units of broadcasting station data in said storage means based on said inputted indication of the type of the received broadcast program, and the frequency of the broadcast radio waves of the broadcast program which has been regenerated, and selects the corresponding unit of broadcasting station data so that the current position of the radio receiver is determined based on the unit of broadcasting station data which has been selected by said retrieval means.

11. The radio receiver as claimed in claim 9, wherein said position information determining means furthermore comprises: memory means for successively recording in a complementary memory unit the frequencies of broadcast radio waves received by means of said received signal processing unit in an initial set of received signal processing operations; reception control means which, after said initial set of received signal processing operations performed by said received signal processing unit has been completed, causes a second set of received signal processing operations to be performed on the broadcast radio waves by said received signal processing unit for a plurality of the broadcast radio wave frequencies which have been recorded in said memory unit, wherein during said second set of received signal processing operations, an indication of the type of broadcast program received is inputted for each broadcast radio wave frequency; and a retrieval means which, when said indications of the types of broadcast programs have been input, retrieves said broadcasting station data in said storage unit, and based on the frequencies of the received signal radio waves and said types of broadcast programs for the received broadcast radio waves, determines the corresponding broadcasting station data, and the broadcasting station position information corresponding to the current position of the radio receiver is determined based on the broadcasting station data which has been selected by said retrieval means.

12. A radio receiver for receiving broadcast radio waves from a plurality of different broadcast stations that transmit broadcast programs, each broadcast program being a particular type of broadcast program, comprising:

a storage unit which stores a plurality of units of broadcasting station data, where each said unit includes classification data comprising the broadcast frequency for a broadcast radio program, the type of broadcast program, and position information indicating the position of the broadcast station transmitting the broadcast program;

a received signal processing unit which performs received signal processing on the broadcast radio waves and regenerates the broadcast programs;

a position information determining means for determining the current position of the radio receiver, based on the received broadcast radio programs, said position information determining means being provided with an input means for inputting selection information for indicating a first, wide geographic area in which the radio receiver is located and an indication of the type of broadcast program that is regenerated by said received signal processing unit, a broadcast frequency retrieval means which retrieves broadcast frequencies which can be received by said received signal processing unit in the wide geographic area in which the radio receiver is located, a primary decision means which compares the broadcast frequencies retrieved by means of said broadcast frequency retrieval means and the inputted types of broadcast programs for the regenerated broadcast programs with the broadcast frequencies and the program types in the broadcasting station data for the broadcast stations in the wide geographic area in which the radio receiver is located that are stored in said storage unit, and specifies a second, narrow geographic area based on the number of agreements between the frequencies and inputted program types of the received broadcast stations and the frequencies and program types contained in the stored broadcast station data and a secondary decision means which, when it is impossible to specify a second narrow geographic area based on the number of agreements of the broadcast frequencies and program types for the narrow geographic areas, specifies the narrow geographic area based on the greatest correlation of agreements resulting from a comparison of the broadcast frequencies and the inputted program types of the received broadcast stations with the broadcast frequencies and program types of the stored broadcasting station data in the wide geographic area region for the narrow geographic areas within the wide geographic area.

13. The radio receiver as claimed in claim 12, wherein said primary decision means of said position information determining means compares the broadcast frequencies retrieved by said broadcast frequency retrieval means with the broadcast frequencies contained in the stored broadcasting station data for the inputted wide geographic area, determines the number of narrow geographic areas within the wide geographic area with the greatest number of agreeing frequencies in which said broadcast frequencies and program types are in agreement, and if the number of narrow geographic areas with the greatest number of agreements is one, then the narrow geographic area with the greatest number of agreements is specified as the current position, and if the number of said narrow geographic areas with the greatest number of agreements is more than one, then said primary decision means is not employed specify the second information area.

14. A method of determining the position of a radio receiver, said method including the steps of:

providing an indication to a processing unit of a basic geographic region in which the radio receiver is located;

tuning the radio receiver to a broadcast station, extracting the carrier frequency of the broadcast station, forwarding the carrier frequency to said processing unit, and reproducing the program being broadcast;

entering into said processing unit an indication of the program format of the program being broadcast; and said processing unit determining the position of the broadcast station as the position of the radio receiver by reference to a station file for said basic geographic region, said station file including a plurality of station records for individual broadcast stations, each said station record containing an indication of the carrier frequency, program format and location of a broadcast station, wherein said processing unit matches the carrier frequency and program format of the received broadcast station with the data contained in one said station record so that the location contained in said matched station record is recognized as the position of the received broadcast station.

* * * * *